United States Patent [19]
Maas et al.

[11] Patent Number: 5,848,265
[45] Date of Patent: Dec. 8, 1998

[54] CIRCUIT AND METHOD FOR MEASURING THE DIFFERENCE FREQUENCY BETWEEN TWO CLOCKS

[75] Inventors: Michael F. Maas, West St. Paul; Bret A. Oeltjen, Apple Valley, both of Minn.

[73] Assignee: Cypress Semiconductor Corp., San Jose, Calif.

[21] Appl. No.: 920,200

[22] Filed: Aug. 25, 1997

[51] Int. Cl.$^6$ ....................................................... G06F 1/04
[52] U.S. Cl. .............................................................. 395/555
[58] Field of Search ..................................... 395/555, 556; 331/1 R, 2, 46, 175; 327/39, 40, 42

[56] References Cited

U.S. PATENT DOCUMENTS

| | | | |
|---|---|---|---|
| 4,598,257 | 7/1986 | Southard | 331/2 |
| 5,491,439 | 2/1996 | Kelkar et al. | 327/157 |
| 5,652,532 | 7/1997 | Yamaguchi | 327/39 |
| 5,682,112 | 10/1997 | Fukushima | 327/147 |

*Primary Examiner*—Thomas M. Heckler
*Attorney, Agent, or Firm*—Maiorana & Acosta, P.C.; Christopher P. Maiorana

[57] ABSTRACT

A circuit for measuring the frequency difference between a reference clock and a second clock. The circuit presents a first output in response to a phase crossing between the two clocks. A second circuit presents a second output in response to the first output and the reference clock.

20 Claims, 5 Drawing Sheets

```
case(state)
  PHASE45:
    if(divRefSync && !divClkSync)
      begin
        change  = 1;
        newCode = {code[2],1'b0,!code[1] || code[0]};
        newState = PHASE315;
      end
    else if(!divRefSync && divClkSync)
      begin
        change  = 1;
        newCode = {code[2],!code[0] || code[1],1'b0};
        newState = PHASE135;
      end
    else if(!divRefSync && !divClkSync)
      begin
        change  = 1;
        if(!code[2])
          newCode = {1'b1,code[1] ~^ code[0],code[1] ~^
code[0]};
        else
          newCode = 3'b111;
        newState = PHASE225;
      end
    else
      begin
        change  = 0;
        newCode = code;
        newState = PHASE45;
      end
  PHASE135:
    if(divRefSync && divClkSync)
      begin
        change  = 1;
        newCode = {code[2],1'b0,!code[1] || code[0]};
        newState = PHASE45;
      end
    else if(!divRefSync && !divClkSync)
      begin
        change  = 1;
        newCode = {code[2],!code[0] || code[1],1'b0};
        newState = PHASE225;
      end
    else if(divRefSync && !divClkSync)
      begin
        change  = 1;
        if(code[2])
          newCode = {1'b0,code[1] ~^ code[0],code[1] ~^
code[0]};
        else
          newCode = 3'b011;
        newState = PHASE315;
      end
    else
      begin
        change  = 0;
        newCode = code;
        newState = PHASE135;
      end
  PHASE225:
    if(!divRefSync && divClkSync)
      begin
        change  = 1;
        newCode = {code[2],1'b0,!code[1] || code[0]};
        newState = PHASE135;
      end
    else if(divRefSync && !divClkSync)
      begin
        change  = 1;
        newCode = {code[2],!code[0] || code[1],1'b0};
        newState = PHASE315;
      end
    else if(divRefSync && divClkSync)
      begin
        change  = 1;
        if(!code[2])
          newCode = {1'b1,code[1] ~^ code[0],code[1] ~^
code[0]};
        else
          newCode = 3'b111;
        newState = PHASE45;
      end
    else
      begin
        change  = 0;
        newCode = code;
        newState = PHASE225;
      end
  PHASE315:
    if(!divRefSync && !divClkSync)
      begin
        change  = 1;
        newCode = {code[2],1'b0,!code[1] || code[0]};
        newState = PHASE225;
      end
    else if(divRefSync && divClkSync)
      begin
        change  = 1;
        newCode = {code[2],!code[0] || code[1],1'b0};
        newState = PHASE45;
      end
    else if(!divRefSync && divClkSync)
      begin
        change  = 1;
        if(code[2])
          newCode = {1'b0,code[1] ~^ code[0],code[1] ~^
code[0]};
        else
          newCode = 3'b011;
        newState = PHASE135;
      end
    else
      begin
        change  = 0;
        newCode = code;
        newState = PHASE315;
      end
```

CIRCUIT AND METHOD FOR MEASURING THE DIFFERENCE FREQUENCY BETWEEN TWO CLOCKS

FIELD OF THE INVENTION

The present invention relates to clocks generally and, more particularly, to a circuit for measuring the frequency difference between a reference clock signal and a second clock signal.

BACKGROUND OF THE INVENTION

Conventional circuits used to determine the difference in frequency between two clocks generally employ counters. The first counter is used to establish a sampling interval, which typically comprises a large multiple of the reference clock. A second counter is generally employed to count the number of events on the second clock within the reference sampling interval. A difference frequency is then computed by subtracting the reference counter from the second counter, resulting in a difference in frequency expressed in cycles per sample interval.

Conventional approaches used to determine the difference in frequency between two clocks generally require that both a reference clock as well a second clock be counted. To measure small differences in frequency with a small measurement error, both counters generally grow in proportion to the accuracy required. Since the frequency difference (sometimes referred to as a frequency mismatch) can be either a positive or negative difference, two unique comparitors must be included to ensure that the second counter does not exceed a maximum reference count, nor fall below a minimum reference count.

Referring to FIG. 1, a block diagram of a conventional approach for determining the difference between two frequencies using two counters is shown. The circuit 10 generally comprises a reference counter 12, a second counter 14, a compare block 16, a compare block 18 and a gate 20. The reference counter block 12 receives a reference clock at an input 22 and presents a reference interval strobe signal at an output 24. The counter 14 receives a second clock signal at an input 26 and presents an output signal at an output 28. The output signal is presented to an input 30 of the compare block 16 as well as to an input 32 of the compare block 18. The compare block 16 ensures an upper limit of the signal received at the input 30 and presents a signal at the output 34. Similarly, the compare block 18 ensures a lower limit of the input received with the input 32 and presents a signal at an output 36. The signals presented at the outputs 24, 34 and 36 are each presented to the gate 20 which in turn presents an output match signal.

SUMMARY OF THE INVENTION

The present invention concerns a circuit for measuring the frequency difference between a reference clock and a second clock. The circuit presents a first output in response to a phase crossing between the two clocks. A second circuit presents a second output in response to the first output and the reference clock.

The objects, features and advantages of the present invention include providing a circuit configured to measure the difference in frequency between two clocks while implementing a minimum amount of circuitry.

BRIEF DESCRIPTION OF THE DRAWINGS

These and other objects, features and advantages of the present invention will be apparent from the following detailed description and the appended claims and drawings in which:

FIG. 8 is a verilog HDL description of the operation of the state machine.

DETAILED DESCRIPTION OF THE PREFERRED EMBODIMENTS

The present invention concerns a circuit and method for generating a difference clock from a reference clock and a second clock. A pulse stream may be generated representing the difference clock having a number of clock events that may be directly proportional to an absolute value of the difference in the number of clock events between the reference clock and the second clock. When the reference and second clocks match in frequency, no pulses are emitted. To implement frequency matching detection, a counter for the reference clock may be required. However, the difference clock may be counted by a second counter. Since the difference clock is generally directly proportional to the difference in frequency between the reference clock and second clock, the size of the second counter may be decreased as the matching tolerance is tightened. Since the difference clock may be represented as an absolute value, i.e., the difference without regard to the sign of the frequency difference, only a single comparison or boundary condition may be required to determine the matching tolerance of the circuit.

Figure 1:
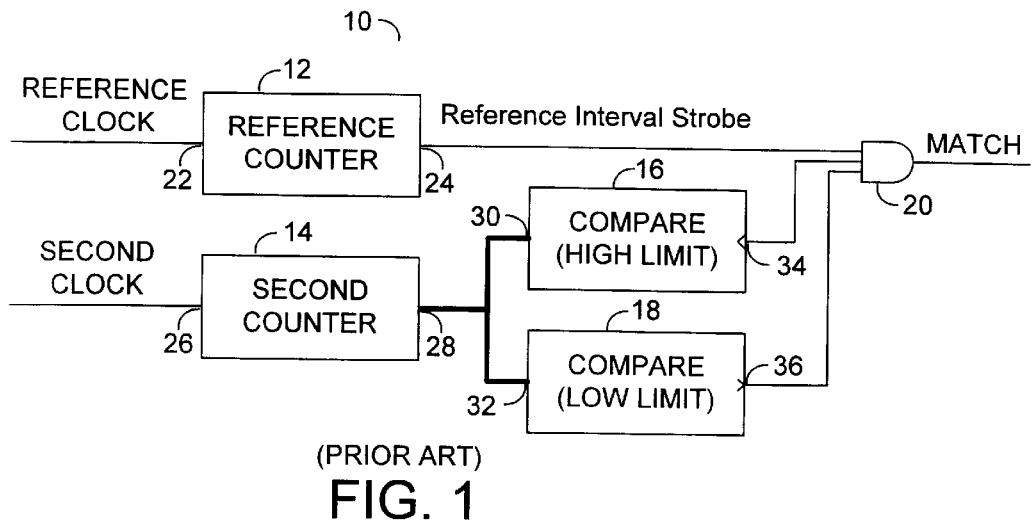
FIG. 1 is a block diagram of a circuit illustrating a conventional approach to measuring the difference in frequency between two clocks.
Figure 2:
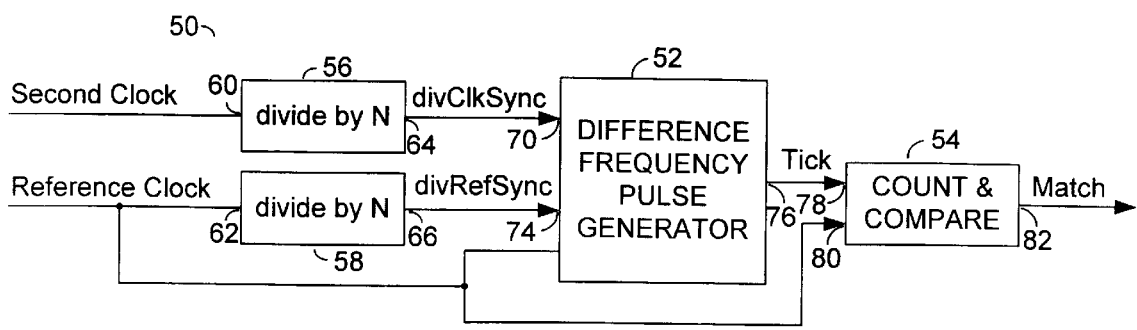
FIG. 2 is a block diagram of a preferred embodiment of the present invention.

Referring to FIG. 2, a block diagram of a circuit 50 is shown in accordance with a preferred embodiment of the present invention. The circuit 50 generally comprises a difference frequency pulse generator block (or circuit) 52 and a count and compare block (or circuit) 54. The circuit 50 also includes a divide by N counter 56 and a divide by N counter 58. The number N may represent an integer multiple which the circuits 56 and 58 divide into an input frequency. In one example, the value N may be equal to 3. However, other values of N may be implemented accordingly to meet the design criteria of a particular application. The divide by N counters 56 and 58 may be implemented to reduce the effects of jitter by synchronizing each transition to a coarser frequency. Certain design applications may not require such filtering and may eliminate the divide by N counters 56 and 58. Other design applications may benefit from the divide by N counters 56 and 58 being programmable, in some cases to different values, after fabrication of the circuit 50.

The circuit 56 has an input 60 that may receive an input clock signal (e.g., second clock), while the circuit 58 may have an input 62 that may receive another input clock signal (e.g., reference clock). The circuit 56 may have an output 64 that may present a divided clock signal (e.g., divClkSync), while the circuit 58 may have an output 66 that may present a divided reference clock signal (e.g., divRefSync).

The difference frequency pulse generator 52 may have an input 70 that may receive the divided clock signal, an input 72 that may receive the divided reference clock signal and an input 74 that may receive the reference clock signal. The difference frequency pulse generator 52 may present an output signal (e.g., Tick) that may pulse each time the phase angle between the signals received at the inputs 70 and 72 passes through zero. The count and compare block 54 may have an input 78 that may receive the output signal Tick and an input 80 that may receive the reference clock signal. The counting compare block 54 counts the signals received at the inputs 78 and 80 and may present a signal (e.g., match) at an input 80. The signal match generally represents a signal generated by a comparison between the counted values of the signals received at the inputs 78 and 80 that may indicate that the second clock signal is within a predetermined tolerance of the reference clock signal.

Figure 3:
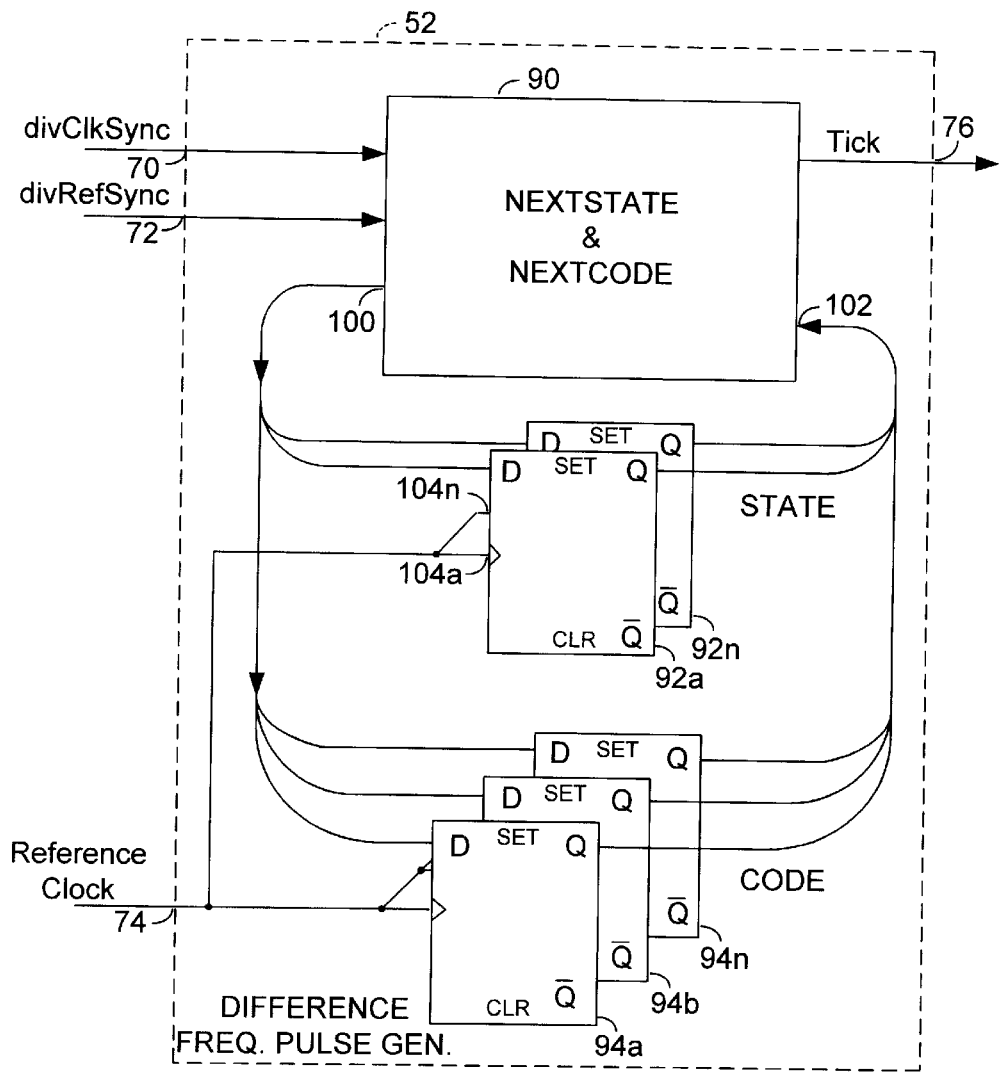
FIG. 3 is a block diagram of the difference frequency pulse generator circuit of FIG. 2.

Referring to FIG. 3, a block diagram of the difference frequency pulse generator circuit 52 is shown. The circuit 52 generally comprises a state machine 90, a number of flip flops 92a–92n (generally referred to as state flip flops) and a number of flip flops 94a–94n (generally referred to as code flip flops). The state machine 90 may present a signal at an output 100 that may be received at the D inputs of both the state flip flops 92a–92n and the code flip flops 94a–94n. The Q outputs of the state flip flops 92a–92n and the code flip flops 94a–94n may be presented to an input 102 of the state machine 90. The state machine 90 then presents the output tick in response to the signals received from the state flip flops 92a–92n and the code flip flops 94a–94n. The reference clock received at the input 74 may be presented to the clock inputs 104a–104n.

The state machine 90 generally tracks the changing phase relationship between the signal received at the input 70 with respect to the signal received at the input 72. The tick output presented at the output 76 pulses each time the phasing between the inputs passes through a zero as detected by a specific sequence of states encountered by the state flip flops 92a–92n. The code flip flops 94a–94n generally track a history of past states sufficient to determine the zero crosses between the two input signals. Additionally, the code flip flops 94a–94n may prevent redundant state transitions from signaling phase crossings. The operation of the state machine 90 with respect to the state flip flops 92a–92n and the code flip flops 94a–94n will be described in more detail in connection with FIGS. 5–8.

Figure 4:
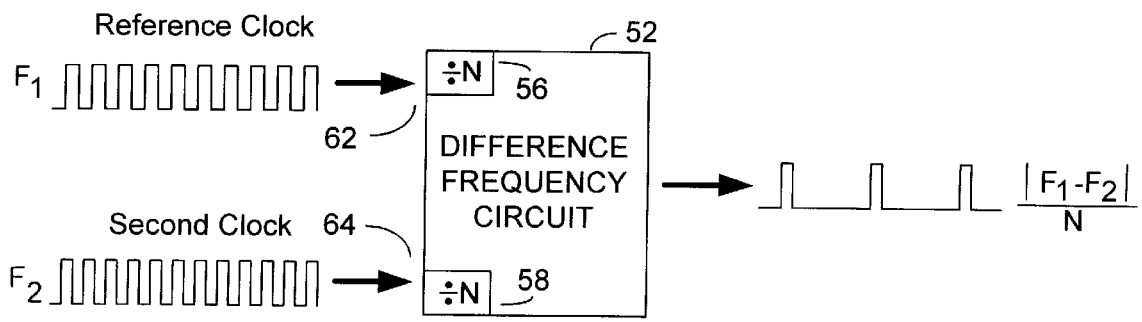
FIG. 4 is a functional diagram illustrating the operation of the difference frequency pulse generator circuit.

Referring to FIG. 4, a conceptual block diagram of the difference frequency circuit 52 is shown. The reference clock and the second clock shown graphically as signals F1 and F2, respectively. The output is shown as a series of pulses which generally represents the reference clock minus the second clock divided by the particular divide by number N. The output may be generated in other useful forms such as a waveform having a transition at each pulse.

Figure 5:
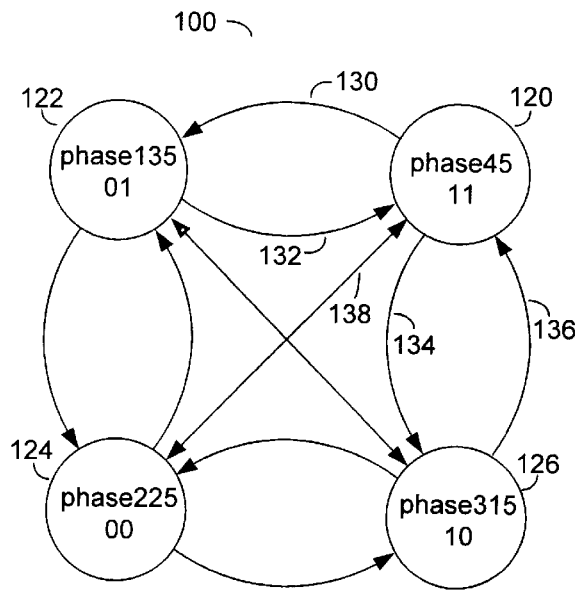
FIG. 5 is a state diagram of illustrating the functional operation of the state machine of FIG. 3.

FIG. 5 is a state diagram 100 illustrating the operation of the state machine 90. The state machine 90 generally comprises a phase45 state 120, a phase135 state 122, a phase225 state 124 and a phase315 state 126. The state 120 may also be represented by the binary reference 11, the state 122 may also be represented by the binary reference 01, the state 124 may also be represented by the binary reference 00 and the state 126 may also be represented by the binary reference 10. The state diagram 100 generally represents a configuration such that any particular state 120–126 may progress to any other particular state 120–126 in a generally direct fashion. Specifically, the state 120 has an exit 130 allowing progression to the state 122 as well as an entry 132 to return from the state 122. Similarly, an exit 134 and a corresponding entry 136 connect the state 120 to the state 122. An entry/exit 138 allows the progression between the state 120 and state 124. The states 122, 124 and 126 have similar configurations with the remaining states.

Figure 6A:
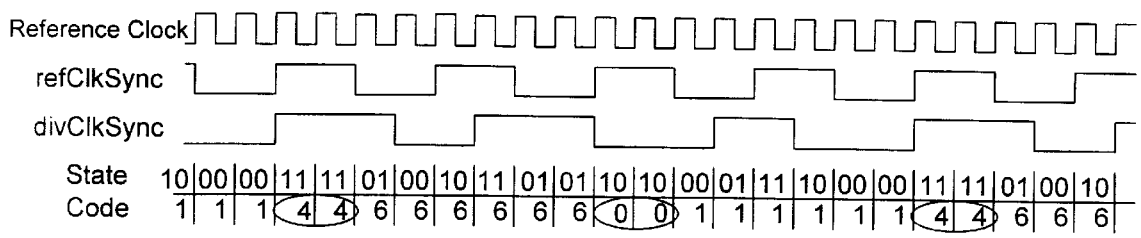
FIGS. 6a and 6b show waveforms illustrating the function of the state machine of FIG. 3.
Figure 6B:
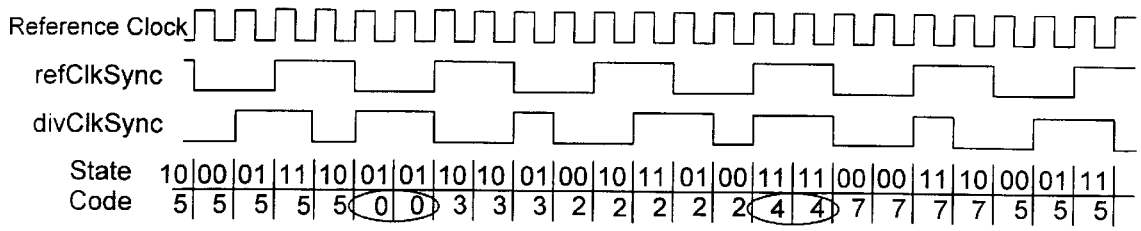

Referring to FIG. 6a and 6b, two input sequences are shown that illustrate the detection of phase crossings by the circuit 50. In both FIGS., values for state are expressed in binary, while values for code are expressed in octal. FIG. 6a illustrates a state and code progression for the case where the second clock has a frequency less than that of the reference clock. The values of code circled in the FIG. are values which indicate phase crossings. These code values are used to derive the output response of the circuit referred to as tick. FIG. 6b illustrates a state and code progression for the case where the second clock has a frequency greater than that of the reference clock. The values of code circled in the FIG. are values which indicate phase crossings. As a result, other useful output responses may be derived. For example, the difference in code sequence between FIG. 6a and FIG. 6b illustrates that the two cases could be distinguished as part of a more complex output response.

Figure 7:
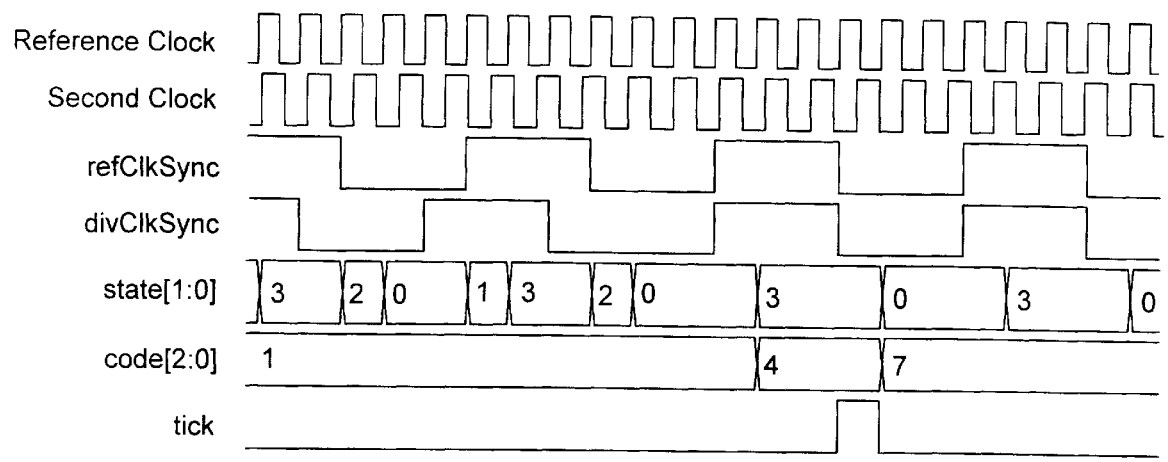
FIG. 7 is a timing diagram illustrating the operation of the circuit of FIG. 3.

Referring to FIG. 7, a timing diagram illustrating the various inputs and outputs of the circuit 50 are shown. The simulation waveforms illustrate the general function of the circuit. The reference clock signal and the second clock signal generally control the state flip flops 92a–92n (e.g., state [1:0]), and the code flip flops 94a–94n (e.g., code [2:0]). The output Tick is shown having a high pulse when the synchronized reference clock and the synchronized divide clock are equal on the falling edges.

The divisor (e.g., N) used in creating the synchronized divide clock and the synchronized reference clock may be adjusted to meet the design criteria of the particular application. Additionally, the divisors may be implemented as a programmable feature which may allow post-production configuration of the device, which is generally desirable. The divisors may be used to control the "gain" of the difference in function in a frequency domain. For example, a sampling clock, such as an independent clock having a frequency at least twice the frequency of the clocks being compared, would generally be another useful implementation. Such an implementation would allow for a 1:1 difference frequency output.

Referring to FIG. 8, a verilog HDL description of the implementation of the state machine implemented in FIG. 5 is shown. The verilog description is generally divided into a section for the phase45 state 120, a section for the phase135 state 122, a section for the phase225 state 124 and a section for the phase315 state 126.

The syntax of FIG. 8 is understood to be an example of verilog hardware description language (HDL) as defined by the IEEE 1364–1995 standard. While the code illustrated in FIG. 8 explicitly defines the conditions for the "state" and "code" transitions as a function of the inputs "difRefSync" and "divClkSync", other implementations, including, but not limited to, discrete logic components, may be implemented to meet the design criteria of a particular application.

Referring to FIG. 8. The "case(state)" construct causes evaluation to pass to the section representing the current state of the circuit 50. For example, if the current state is PHASE315 (binary 10), then the code evaluation starts at the label "PHASE315:" and the other sections are ignored. Within the section e.g., "PHASE315:" the else/if construct is evaluated sequentially using current values of state, code, and inputs. The first true conditional associated parenthetically to an "if( . . . )" or "else if( . . . )" causes the procedure immediately following to be executed. If none of the conditionals is true, the procedure following the "else" construct is executed. A procedure is generally defined as a sequence of value assignments enclosed in a begin/end pair. When the values for code and state have been modified according to the procedure indicated by current state, input, and code values, the evaluation passes back to the "case(state)" for re-evaluation with updated state and code and input values. The "!" symbol means negation in the logical sense. The symbols "&&" and "∥" mean logical AND and logical OR respectively. Binary vector quantities are optionally expressed using bracket notation. For example, notation for the three bit binary quantity "code" can be expressed in the following equivalence: code={[code[2], code[1],code[0]]}. "1'b0" is an example of a one bit binary constant having a logic 0 value. The operator "~^" means logical EXCLUSIVE NOR of the operands.

While the invention has been particularly shown and described with reference to the preferred embodiments thereof, it will be understood by those skilled in the art that various changes in form and details may be made without departing from the spirit and scope of the invention.

We claim:

1. A circuit comprising:
   a first circuit configured to present a first output in response to (i) a first clock and (ii) a second clock, wherein said first output represents a phase crossing of said first and second clocks; and
   a compare circuit configured to present a second output in response to (i) said first output and (ii) a reference clock.

2. The circuit according to claim 1, wherein said first circuit generates said first output in further response to said reference clock.

3. The circuit according to claim 1 further comprising:
   a first divide circuit configured to present said first clock in response to said reference clock, wherein said first clock has a frequency less than said reference clock.

4. The circuit according to claim 3, further comprising:
   a second divide circuit configured to present a modified second clock in response to said second clock, wherein said modified second clock has a frequency less than said second clock.

5. The circuit according to claim 1, wherein said compare circuit comprises a count and compare circuit.

6. The circuit according to claim 1, wherein said first clock is generated in response to said reference clock.

7. The circuit according to claim 1, wherein said first circuit comprises:
   a state machine configured to present said output in response to (i) a frequency of said first clock, (ii) a frequency of said second clock and (iii) a frequency of said reference clock.

8. The circuit according to claim 7, wherein said first circuit further comprises:
   a plurality of flip flops configured to provide frequency information to said state machine, wherein said state machine presents said output in further response to said frequency information.

9. A circuit comprising:
   means for generating a first output in response to (i) a first clock and (ii) a second clock, wherein said first output represents a phase crossing of said first and second clocks; and
   means for generating a second output in response to (i) said first output and (ii) a reference clock.

10. The circuit according to claim 9, wherein said means for generating said first output further responds to said reference clock.

11. The circuit according to claim 10, further comprising:
    means for generating said first clock in response to said reference clock, wherein said first clock has a frequency less than said reference clock.

12. The circuit according to claim 10, further comprising:
    means for generating a modified second clock in response to said second clock, wherein said modified second clock has a frequency less than said second clock.

13. The circuit according to claim 10, wherein said means for generating said first output comprises:
    a state machine configured to present said first output in response to (i) a frequency of said first clock, (ii) a frequency of said second clock and (iii) a frequency of said reference clock.

14. The circuit according to claim 13, wherein said means for generating said first output comprises:
    a plurality of flip flops providing frequency information to said state machine.

15. A method for determining the frequency difference between first and second clocks comprising the steps of:
    generating a first signal in response to a phase crossing of a first clock and a second clock, wherein said first signal has a state changing in response to said first and second clocks; and
    generating a second signal representing the frequency difference between said first and second clocks in response to a comparison of said first signal and a reference clock.

16. The method according to claim 15, further comprising the step of:
    dividing said reference clock by a predetermined value to generate said first clock having a frequency less than said reference clock.

17. The method according to claim 16, further comprising the step of:
    dividing said second clock by a predetermined value, to generate a modified second clock having a frequency less than said second clock.

18. The method according to claim 15 wherein said generating step further comprises:
    generating said output in response to (i) a frequency of said first clock, (ii) a frequency of said second clock and (iii) a frequency of said reference clock.

19. The method according to claim 15, wherein said second signal is generated in response to a state history of said first signal.

20. The method according to claim 19, wherein said second signal is generated in further response to said state history.

* * * * *